United States Patent [19]
Miura

[11] Patent Number: 4,755,479
[45] Date of Patent: Jul. 5, 1988

[54] MANUFACTURING METHOD OF INSULATED GATE FIELD EFFECT TRANSISTOR USING REFLOWABLE SIDEWALL SPACERS

[75] Inventor: Takao Miura, Tokyo, Japan
[73] Assignee: Fujitsu Limited, Kanagawa, Japan
[21] Appl. No.: 10,667
[22] Filed: Feb. 4, 1987

[30] Foreign Application Priority Data

Feb. 17, 1986 [JP] Japan .............................. 61-033237
Feb. 17, 1986 [JP] Japan .............................. 61-033236

[51] Int. Cl.⁴ ................... H01L 21/223; H01L 21/265
[52] U.S. Cl. ......................................... 437/44; 437/45;
437/157; 437/247; 437/947; 437/982;
148/DIG. 44; 148/DIG. 106; 148/DIG. 157;
148/DIG. 161; 156/643; 357/23.12
[58] Field of Search ............... 29/571, 576 B, 576 W,
29/577 C, 578, 591; 148/187, DIG. 42, 35, 44,
51, 53, 76, 82, 83, 106, 133, 145, 157, 161;
156/643, 646, 662; 357/23.3, 23.12, 68, 71, 54;
427/93; 437/44

[56] References Cited

U.S. PATENT DOCUMENTS

| | | | |
|---|---|---|---|
| 4,349,584 | 9/1982 | Flatley et al. | 357/54 |
| 4,356,623 | 11/1982 | Hunter | 29/576 B |
| 4,371,403 | 2/1983 | Ikubo et al. | 148/187 |
| 4,404,733 | 9/1983 | Sasaki | 29/571 |
| 4,419,809 | 12/1983 | Riseman et al. | 29/576 B |
| 4,507,853 | 4/1985 | McDavid | 29/591 |
| 4,586,968 | 5/1986 | Coello-Vera | 148/187 |
| 4,593,454 | 6/1986 | Baudrant et al. | 29/591 |
| 4,603,472 | 8/1986 | Schwabe et al. | 29/576 B |
| 4,616,401 | 10/1986 | Takeuchi | 29/576 W |
| 4,641,420 | 2/1987 | Lee | 29/577 C |

FOREIGN PATENT DOCUMENTS

| | | | |
|---|---|---|---|
| 0047769 | 3/1984 | Japan . | |
| 0092573 | 5/1984 | Japan . | |
| 0004264 | 1/1985 | Japan | 357/23.3 |

OTHER PUBLICATIONS

Ghandhi, "VLSI Fabrication Principles", John Wiley & Sons, New York, N.Y., 1983, pp. 493-495 & 582-585.

Primary Examiner—Brian E. Hearn
Assistant Examiner—William Bunch
Attorney, Agent, or Firm—Armstrong, Nikaido, Marmelstein & Kubovcik

[57] ABSTRACT

With an increase of integration density in an integrated circuit, the channel length of MIS FET becomes shorter and shorter, which causes a hot carrier effect. To solve the problem, the doping profile of source/drain regions and doping amount must be precisely controlled such that a strong electric field is not generated in a transition region from channel to drain. To obtain this objective, the present invention discloses a method, in which reflowed sidewalls of doped silicate glass having a gentle slope are formed on both sides of a gate electrode, and the gate electrode and the sidewalls thus formed are used as a mask for ion implantation. The depth of ion implantation and the doping amount change gradually from the channel region to the drain region avoiding a generation of the strong electric field and thus alleviates the short channel trouble. The present invention has also an effect of obtaining a passivation layer having gentle slope on the surface and avoiding a broken wire trouble of aluminum wiring.

5 Claims, 5 Drawing Sheets

MANUFACTURING METHOD OF INSULATED GATE FIELD EFFECT TRANSISTOR USING REFLOWABLE SIDEWALL SPACERS

BACKGROUND OF THE INVENTION

1. Field of the Invention

This invention relates to a manufacturing method of an Insulated Gate or Metal Insulator Semiconductor (abbreviated hereinafter as MIS) Field Effect Transistor (abbreviated hereinafter as FET) formed in an integrated circuit having a high integration density. More particularly, this invention relates to an improvement in doping profiles for an active region of MIS FET having a short channel length.

It is known that a short channel length in FET structure causes a fluctuation or a defect of FET characteristics with an increasing integration density. A change in such as threshhold voltage, transconductance, breakdown voltage characteristic of a drain junction, and the like is caused by a punch-through phenomenon or a hot carrier effect generated in a channel region or its vicinity of the MIS FET. This invention is intended mainly to alleviate the above hot carrier effect.

2. Description of the Prior Art

Hot carrier effect is enhanced by a strong electric field existing in a depletion layer especially near the p-n junction surface of a drain region. A part of electrons, including those generated by an impact ionization caused by a carrier electron, is accelerated toward a gate insulating film by the electric field and is trapped in the gate insulating film resulting in a change of threshhold voltage and other characteristics. In order to solve the problem in the prior art, a device technology called as Lightly Doped Drain (abbreviated as LDD) is a typical example and has been utilized.

FIGS. 1 through 4 show cross sectional views corresponding successive steps in a fabrication of LDD. In FIG. 1, a gate insulating film 3 is formed on an active region 8 of a p-type silicon substrate 2, and the active region 8 is surrounded by a field oxide layer 1 and separated from other active elements. A polysilicon layer is deposited and patterned by a conventional photolithography technology, forming a gate electrode 4.

Next, phosphorous ions (P+) or arsenic ions (As+), having a comparatively low accelerating voltage and a low dose density, are implanted in a direction shown by the arrows using the gate electrode 4 as a mask, then two n⁻ regions 5A and 6A are formed.

Then a silicon dioxide ($SiO_2$) layer 7 is deposited by CVD method as shown in FIG. 2. Silicon dioxide layer 7 is subjected to a Reactive Ion Etching (abbreviated as RIE), thereby the layer 7 is etched anisotropically, remaining sidewalls 7A of silicon dioxide on both sides of gate electrode 4. This is shown in FIG. 3.

And next FIG. 4 shows that the substrate is implanted with arsenic ions (As+) having a high accelerating voltage and a high dose density, forming n+ regions 5B and 6B. A source region 5 is formed by n⁻ region 5A and n+ region 5B, and a drain region 6 is formed by n⁻ region 6A and n+ region 6B.

In an LDD structure such as explained above, carrier electrons traveling toward drain region 6 encounter two junctions, a first p-n junction between p-type substrate and n⁻ region 6A and a second n⁻-n+ junction between regions 6A and 6B. If the applied voltages for each electrode are the same, the electric field strengths near the junction surfaces are remarkably reduced compared with that formed near a p-n+ junction of the conventional MIS FET structure.

The LDD structure above disclosed requires a strict control of a doping profile and an impurity distribution. Moreover, the inside front periphery A and A' of n⁻ regions 5A and 6A facing with each other in FIG. 4 advances into the channel region after a subsequent annealing process resulting in making an effective channel length shorter. Furthermore a cross section of the sidewall 7A in FIG. 3 generally shows a convex shape outwardly, therefore the inside profile of n+ regions 5B and 6B also changes depending on a shape of sidewalls 7A formed by RIE method. Further these two impurity regions (5A, 6A) and (5B, 6B) are affected by an ion implantation voltage and a doping amount.

Because the exact control on the above processes is rather difficult problem, further improvements have been required.

Even if the above conditions are fulfilled, an LDD structure can not avoid to involve an abrupt change of an electric field on a boundary surface between n⁻ and n+ regions, therefore the LDD also can not avoid completely the hot carrier effect.

Another method of forming sidewalls, applying a method of spin-coating the so-called Spin On Glass (conventional name and abbreviated as SOG) or Silanol on the substrate, are disclosed in the following Japanese Patents; Tokukaisho 59-92573, by K. Mitsui, and Tokukaisho 59-47769, by Y. Wada, et al. However, a spin-coated layer utilizing liquid state coating material shows a concave shape outwardly, and lacks a thickness uniformity depending on a gate pattern or a chip location on a wafer.

SUMMARY OF THE INVENTION

It is a main object of the invention to provide a manufacturing method to form a retrograded junction between a channel and drain regions. A retrograded junction means that a doping profile and an impurity density are gradually and almost linearly changing from p-type channel region to n⁻, n, and then to n+-type drain region without a distinct junction. No abrupt change in doping profile and impurity density is met along a trajectory of a carrier electron when it travels from the source to the drain regions.

It is another object of the present invention to avoid a steep step of a gate electrode on the substrate and to improve a flatness of an aluminum wiring layer formed thereabove by forming sidewalls having a gentle slope, and thus a problem of having a broken wire thereof can be avoided.

These objects are achieved by forming sidewalls of reflowed insulating material such as silicate glass. The doped silicate glass, having a reflow temperature below 1100 °C., may advantageously be utilized for this purpose. Phosphorus pentoxide ($P_2O_5$) is most popular as the doping material, and the silicate glass doped with phosphorus pentoxide is called as Phospho-Silicate-Glass (PSG). Other doping material such as an oxide of boron (B) or arsenic (As), or a combination of these oxides can be used.

In order to form reflowed sidewalls, two methods are disclosed. The first method comprises steps of depositing the insulating material of doped silicate glass on an entire surface of the substrate, next reflowing the doped silicate glass, and final etching process remaining reflowed sidewalls of doped silicate glass. The second method is different from the first method in step order and comprises steps of depositing the insulating material of doped silicate glass on an entire surface of the substrate, next etching it anisotropically remaining sidewalls, and finally reflowing sidewalls.

The object of reflowing the doped silicate glass is to obtain a sidewall having a gentle sloped, almost flat surface, as a result, the sidewalls having a shape of linearly decreasing thickness with an increasing distance from a side of the gate electrode, are obtained.

When the substrate having the gate electrode and sidewalls such as described above is subjected to an impurity ion implantation, a depth of ion penetration into the substrate and a doping amount change linearly from a channel region to a source/drain region. This doping profile reduces a generation of a local strong electric field and consequently contributes to alleviate a hot carrier effect.

The present invention has another advantage of reducing a steep step on the substrate surface. The gate electrode and reflowed sidewalls formed on both sides thereof eliminate steep steps usually encountered in a conventional gate structure of MIS FET. The passivation layer and the wiring layer thereabove can be formed on a comparatively gentle sloped surface of the substrate and the gate electrode. This contributes to reduce a the problem with broken wire during the formation of the wiring or the life of the FET.

Further objects and advantages of the present invention will be apparent from the following description, reference being made to the accompanying drawings wherein preferred embodiments of the present invention are clearly shown.

DETAILED DESCRIPTION OF THE PREFERRED EMBODIMENTS

As a first example according to the present invention, the method of first reflowing process for a doped silicate glass deposited on an entire surface, and subsequent anisotropic etching process forming sidewalls, is explained.

FIGS. 5 through 9 show cross sectional views corresponding to sequential steps of the first example. In these figures, a field oxide layer, which is not directly related with the present invention, is omitted.

Figure 5:
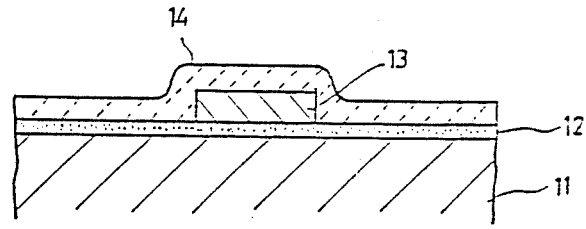
FIGS. 5 through 9 show cross sectional views at successive steps in fabricating MIS FET in accordance with the the present invention, wherein a first method of forming reflowed sidewalls on both sides of gate electrode is disclosed.

In FIG. 5, a gate insulating film 12 is formed on a p-type silicon substrate 11 by a thermal oxidation method, and then a polysilicon layer is deposited and patterned by a conventional photolithography technology, forming a gate electrode 13. An insulating layer 14 of a doped silicate glass is deposited by CVD method.

As the material of the insulating layer 14, silicate glass doped with oxides of phosphorus (P) or boron (B) or arsenic (As), or a combination thereof can be used.

In a case of depositing Phospho-Silicate-Glass (PSG), namely silicate glass containing phosphorus pentoxide ($P_2O_5$), CVD method is applied using monosilane ($SiH_4$), phosphine ($PH_3$), and oxygen ($O_2$) gases, and its reflow temperature depends on a weight percentage of phosphorus pentoxide and a necessary flowability. Silicate glass having 8 to 12 weight percentage has a reflow temperature of ranging 900 to 1050 °C.

When the reflow temperature is required to be lowered further, oxides of boron, or arsenic ($B_2O_5$ or $As_2O_3$ respectively), or a combination thereof can be used as doping material in silicate glass.

Figure 6:
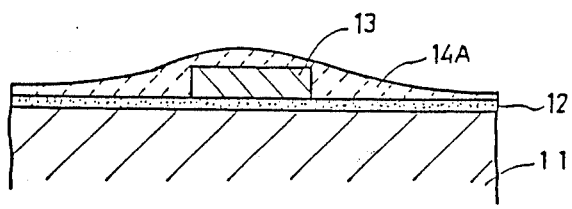

In FIG. 5, the insulating layer 14 of PSG is reflowed in an inert gas at a temperature of 1000° to 1050 °C., then reflowed layer 14A is formed on the substrate 11 as shown in FIG. 6.

Figure 7:
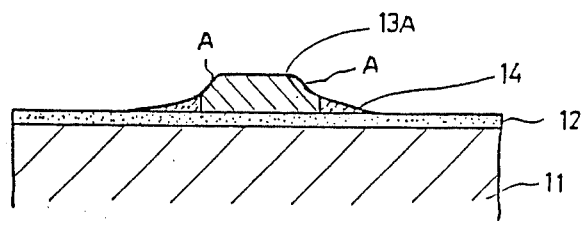

And next, the substrate is subjected to RIE process using a mixed gas of carbon tetrafluoride ($CF_4$) and oxygen. This etching process is stopped when the reflowed glass on the gate electrode and source/drain regions except the vicinity of the gate electrode are removed, remaining sidewalls on both sides of the gate electrode. In FIG. 7, a cross sectional shape of gate electrode and sidewalls are shown when RIE is finished. In the figure, both side edges A of gate electrode 13A are partially removed and form continuous surfaces together with reflowed sidewalls 14B, since polysilicon is etched similarly by the above RIE process.

Figure 8:
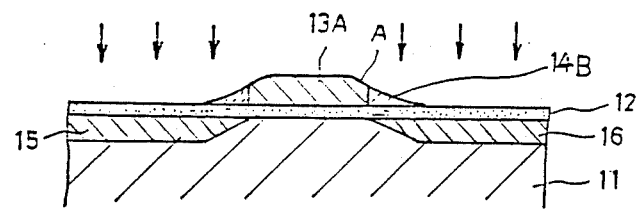

Then impurity ions such as phosphorus or arsenic are implanted using gate electrode 13A and sidewalls 14B as a mask, and source region 15 and drain region 16 are formed, which is shown in FIG. 8. The doping profile and the doping amount in the substrate under the sidewall 14B change gradually and linearly from a channel region to a source/drain region, forming a retrograded junction.

Figure 9:
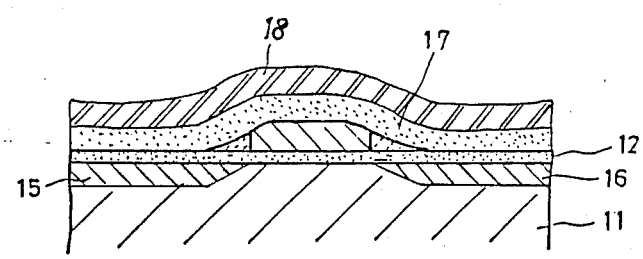

FIG. 9 shows that a passivation layer 17 and wiring layer 18 of aluminum are formed on the substrate by the conventional processes.

Figure 10:
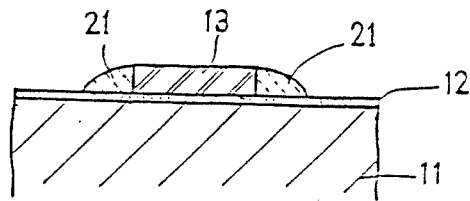
FIGS. 10 through 12 show cross sectional views at principal steps different from the first method in fabricating MIS FET in accordance with the the present invention, wherein the second method of forming reflowed sidewalls is disclosed.
Figure 11:
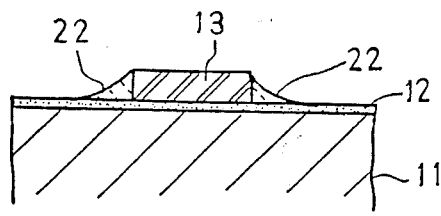

A second example of forming reflowed sidewalls are explained using FIGS. 10 and 11. The first step for the substrate 11 is just the same as shown in FIG. 5, wherein a gate insulating layer 12, a gate electrode 13, and an insulating layer 14 of doped silicate glass are formed on a p-type silicon substrate 11.

Subsequently the substrate is subjected to an anisotropic etching process such as RIE process until the surface of the gate electrode 13 is exposed. At this stage, source/drain regions are partly exposed except the vicinity regions of the gate electrode as shown in FIG. 10.

A portion of the insulating layer 14 is remaining and forming a sidewall 21 on both sides of the gate electrode. Sidewall 21 has a convex shape outwardly in a cross section due to RIE characteristics.

The sidewall 21 is reflowed in an inert gas at a temperature of approximately 1000 °C. The reflow temperature is a little lower than the case applied in the reflowing process for FIG. 6, because a small portion of the silicate glass is subjected to reflowing process in this case.

After the reflowing process, the sidewall 21 presents a comparatively gently sloped surface, forming a reflowed sidewall 22 in FIG. 11.

Figure 12:
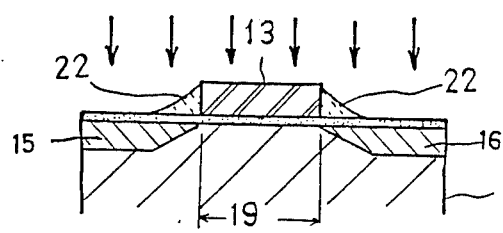

Then as shown in FIG. 12, impurity ions such as phosphorus or arsenic ions are implanted using gate electrode 13 and sidewalls 22 as a mask. Source region 15 and drain region 16 are formed in the substrate, and the depth of the ion penetration gradually increases along the direction from the channel region 19 under the gate electrode 13 to the source/drain regions not covered with the sidewalls.

Next, a passivation layer and wiring layer are formed thereon in the same way as shown in FIG. 9.

Figure 1:
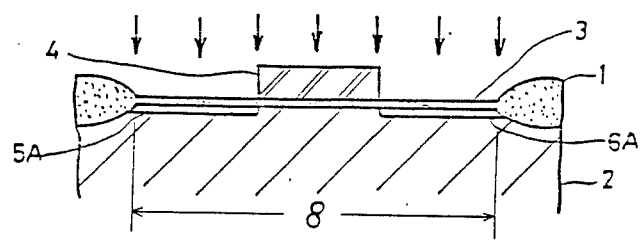
FIGS. 1 through 4 show cross sectional views at successive steps in fabricating an LDD structure in the prior art.
Figure 2:
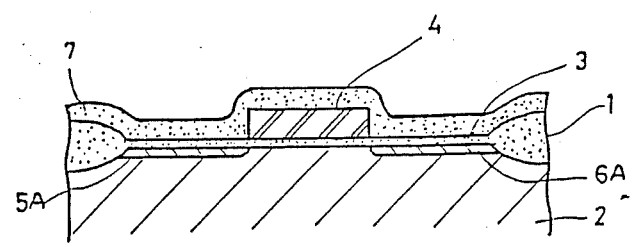
Figure 3:
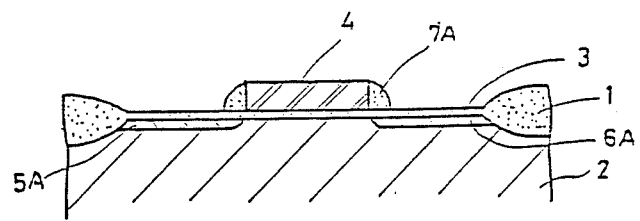
Figure 4:
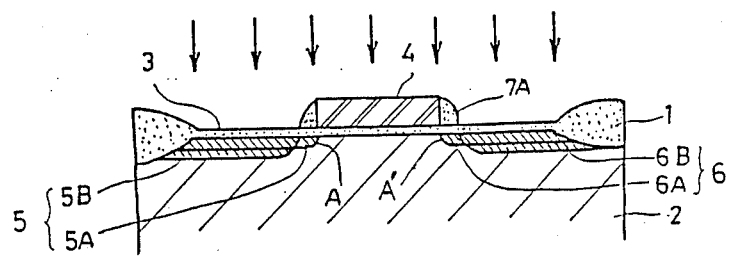

In the above first and second examples, only single step of ion implantation is applied, however, when a different doping profile is required, a multi-step ion implantation technology may be applicable. For example, a first implantation of phosphorus ions is carried out before the deposition of insulating layer 14 in FIG. 5. This is the same process in FIG. 1 of the prior art. And a second implantation of arsenic ions is performed after forming reflowed sidewalls, applying the present invention. A different doping profile can be obtained.

Another advantage of applying the present invention is easy to obtain a passivation layer 17 without steep steps because the gate electrode has a sidewall having a gentle slope on both sides thereof. Therefore reflow process is not necessary for the passivation layer 17. Even if the reflow process becomes necessary, the percentage of doped phosphorus pentoxide in silicate glass can be lowered than those applied in conventional MIS FET structures. Therefore the broken wire trouble of aluminum wiring formed on the passivation layer due to aluminum corrosion can be reduced remarkably, because the chemical reaction of aluminum wiring with water and phosphorus pentoxide contained in the passivation layer is less reactive.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the forgoing description, and all changes which come within the meaning and range of equivalence of the claims are, therefore, to be embraced therein.

What I claim are as follows:

1. A method of manufacturing MIS FET, said method comprising the steps of:
    (a) forming a gate insulating film and a gate electrode on a silicon substrate;
    (b) depositing an insulating material on said substrate and said gate electrode;
    (c) reflowing said insulating material;
    (d) etching said reflowed insulating material until the surface of said gate electrode and substrate for source/drain regions are exposed, thereby making a gradually rising side wall of said reflowed insulating material remain on both sides of the gate electrode; and
    (e) implanting impurity ions into said substrate to form source/drain regions of said MIS FET using said gate electrode and said side walls as a mask, whereby a doping zone having a slanted profile which becomes gradually shallower under an edge of said gate electrode is formed.

2. A method of manufacturing MIS FET, said method comprising the steps of:
    (a) forming a gate insulating film and a gate electrode on a silicon substrate;
    (b) depositing an insulating material on said substrate and said gate electrode;
    (c) etching said insulating material until the surface of said gate electrode and substrate for source/drain regions are exposed, thereby making a side wall of said insulating material remain on both sides of said gate electrode;
    (d) reflowing the remaining insulating material, whereby a gradually rising side wall of said insulating material are formed on both sides of the gate electrode; and
    (e) implanting impurity ions into said substrate to form source/drain regions of said MIS FET using said gate electrode and said side walls as a mask, whereby a doping zone having a slanted profile which gradually becomes shallower under an edge of said gate electrode is formed.

3. A method of manufacturing MIS FET according to claims 1 or 2, wherein said insulating material is a doped silicate glass having a reflow temperature below 1100° C.

4. A method of manufacturing MIS FET according to claim 3, wherein said silicate glass is doped with an oxide of phosphorus (P) or boron (B) or arsenic (As), or a combination thereof.

5. A method of manufacturing MIS FET according to claim 1, wherein said etching step is performed until the surface of said gate electrode is exposed and the surface edge thereof is partly removed, forming a continuous curved surface together with said side wall.

* * * * *